US 7,052,994 B2

(12) United States Patent
Matsubara et al.

(10) Patent No.: US 7,052,994 B2
(45) Date of Patent: May 30, 2006

(54) METHOD FOR MANUFACTURING SEMICONDUCTOR DEVICE, AND PROCESSING SYSTEM AND SEMICONDUCTOR DEVICE

(75) Inventors: Yoshihisa Matsubara, Tokyo (JP); Toshiyuki Takewaki, Tokyo (JP); Manabu Iguchi, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 141 days.

(21) Appl. No.: 09/840,386

(22) Filed: Apr. 23, 2001

(65) Prior Publication Data
US 2001/0036736 A1    Nov. 1, 2001

(30) Foreign Application Priority Data
Apr. 28, 2000    (JP)    ............... P2000-131626

(51) Int. Cl.
*H01L 21/302*    (2006.01)
(52) U.S. Cl. .............. 438/692; 438/691; 134/1.2; 134/1.3
(58) Field of Classification Search ........ 438/691, 438/692, 693, 708; 134/1.1, 1.2, 1.3
See application file for complete search history.

(56) References Cited

U.S. PATENT DOCUMENTS

| 5,952,694 A | * | 9/1999 | Miyawaki et al. | ......... 257/347 |
| 6,169,652 B1 | * | 1/2001 | Klebanoff | ................ 361/234 |
| 6,296,714 B1 | * | 10/2001 | Matsuo et al. | ............... 134/2 |
| 6,376,345 B1 | * | 4/2002 | Ohashi et al. | ............. 438/542 |

FOREIGN PATENT DOCUMENTS

| JP | 06-061217 | 3/1994 |
| JP | 07-221062 | 8/1995 |
| JP | 11-251317 | 9/1999 |

* cited by examiner

*Primary Examiner*—Lan Vinh
(74) *Attorney, Agent, or Firm*—Katten Muchin Rosenman LLP

(57) ABSTRACT

A method for manufacturing a semiconductor device comprises: forming an N region and P region on a substrate, forming wiring so as to connect one or both of these N and P regions; and performing a processing step on a semiconductor substrate on which the upper surface of said wiring is exposed using a liquid, wherein said processing step is performed in a state in which the wavelength of light radiated onto said semiconductor substrate is 500 nm to less than 1 μm, so that problems such as wiring connection defects for which there is the risk of occurring in the cleaning step are prevented by performing the cleaning step during, before or after a step that includes chemical mechanical polishing (CMP) for forming the above wiring.

12 Claims, 11 Drawing Sheets

WAVELENGTH CHARACTERISTICS OF
QUANTUM EFFICIENCY $\eta$ AND SENSITIVITY

METHOD FOR MANUFACTURING SEMICONDUCTOR DEVICE, AND PROCESSING SYSTEM AND SEMICONDUCTOR DEVICE

BACKGROUND OF THE INVENTION

1. Field of the Invention

The present invention relates to a method for manufacturing a semiconductor device, and a processing system and a semiconductor device, and more particularly, to a method for a semiconductor device, a processing system and a semiconductor device which are free of the risk of the occurrence of problems such as defective connections in the wiring.

2. Description of Related Art

In recent years, semiconductor elements have come to be required to employ an increasingly fine structure accompanying the higher levels of integration and higher performance of semiconductor devices. In addition, the wiring that interconnects semiconductor elements is also required to be increasingly fine.

However, in the manufacturing process of these semiconductor devices, as the semiconductor elements and wiring become increasingly fine, the forming accuracy of the pattern is being required to be increasingly high, and the allowable range for wiring defects and deficits is being required to be increasingly narrow.

Here, a conventional method for manufacturing a semiconductor device will be explained with reference to FIGS. 10A, 10B, and 11.

To begin with, as shown in FIG. 10A, N region 2 and P region 3 are formed on the surface of Si wafer (substrate) 1 by ion implantation or the like, and $SiO_2$ film 4 is deposited on Si substrate 1 containing N region 2 and P region 3 by CVD or the like. The total surface area of the above N region 2 is about 1/1000 of the total surface area of P region 3.

Next, contact holes 5, extending to N region 2 and P region 3, are formed in this $SiO_2$ film 4, and these contact holes 5 are filled with a metal such as W, Al or Cu to form plug electrodes 6.

Next, channel wiring grooves 7 are formed in the upper portion of plug electrodes 6, insulating film 8, composed of TiN or the like, is deposited over $SiO_2$ film 4 including wiring grooves 7, and a wiring material in the form of Cu film 9 is deposited using plating technology.

Next, the unnecessary portions of insulating film 8 and Cu film 9 are removed by CMP in order to leave behind only insulating film 8 and Cu film 9 within channel wiring grooves 7, and as shown in FIG. 10B, channel wiring 10, also referred to as damascene wiring or embedded wiring, is formed on plug electrodes 6.

Furthermore, in order to form channel wiring 10 using a method other than CMP such as dry etching, insulting film 8 and Cu film 9 within channel wiring grooves 7 should be left behind using a resist and the like as a mask, and the other unnecessary portions of insulating film 8 and Cu film 9 should be removed by dry etching.

As a result, semiconductor substrate 11 is fabricated on which channel wiring 10 is exposed.

Next, a cleaning step is carried out on semiconductor substrate 11 obtained in this manner using the cleaning system shown in FIG. 11.

The composition of this cleaning system is composed of a wafer holder 15, which holds semiconductor substrate 11 and is able to rotate using a vertical rotating shaft (not shown) as its axial center, a nozzle 16, which supplies a conductive cleaning chemical (or pure water) to semiconductor substrate 11, and a light source 17, which radiates light having a wavelength of 500 nm or less onto a region containing semiconductor substrate 11.

In this cleaning system, the surface of semiconductor substrate 11 is cleaned by supplying cleaning chemical (or pure water) onto its surface while rotating semiconductor substrate 11 in the state in which the wavelength of the light radiated onto semiconductor substrate 11 is 500 nm or less.

In addition, a processing method for a semiconductor substrate has been proposed in which the semiconductor substrate is processed in a state in which light having energy equal to or greater than the band gap (1.12 eV or more in the case of silicon) is shielded or shaded to below a prescribed intensity (brightness) so as not to be irradiated onto the substrate surface (refer to, for example, Japanese Unexamined Patent Application, First Publication, No. Hei 11-251317).

FIG. 14 is a cross-sectional view showing the Cu wiring of a semiconductor substrate that has undergone prescribed processing according to this processing method. In this drawing, the Cu wiring of a semiconductor substrate is composed of wiring 21 connected to a diffusion layer, an insulating film 22 comprised of a silicon oxide film or nitride film, etc., a normally polished W plug 23, a TiN barrier 24, and normally polished Cu wiring 25.

FIG. 15 is a drawing showing the wiring resistance of Cu wiring formed in this manner as measured in a pattern having a length of 1 mm. In the method of the prior art (A in the drawing), although the wiring resistance increases remarkably due to the occurrence of deficits in a portion of the wiring if the width becomes 0.2 μm or less, in the case of this processing method (B in the drawing), wiring resistance is equal to or less than low resistance Cu wiring until the width approaches 0.1 μm.

However, in the case of the cleaning method described above, during cleaning of semiconductor substrate 11 by the conductive cleaning chemical (or pure water), there was the problem of the selective occurrence of wiring defects in channel wiring 10 on the N region 2 side due to galvanic effects caused by photoexcitation.

The reason for this is that, in the case light is radiated from light source 17 onto this semiconductor substrate 11, electromotive force is generated in the PN junction within semiconductor substrate 11 due to galvanic effects caused by photoexcitation. As a result, $Cu^{2+}$ migrate from channel wiring 10 on the P region 3 side towards channel wiring 10 on the N region 2 side, and as shown in FIGS. 12 and 13, the surface of Cu precipitated on channel wiring 10 on the N region 2 side oxidizes resulting in the formation of a highly resistive layer 12 having for its main component CuO on channel wiring 10 on the N region 2 side.

In this cleaning step, although it is ideal to prevent light from radiating onto the PN junction in semiconductor substrate 11, when detecting its presence or inspecting film thickness during transfer of semiconductor substrate 11, a certain quantity of light unavoidably ends up radiating onto semiconductor substrate 11, thereby making it difficult to eliminate wiring defects in channel wiring 10 on the N region 2 side.

In addition, in the above processing method, light that is shielded or shaded to below a prescribed intensity (brightness) has a wavelength corresponding to a wavelength range in which the semiconductor is not excited, and is a wavelength of 1.2 μm or less corresponding to the band gap of silicon.

For example, in a photodiode of an Si-p$^+$-i-n structure having a broad i layer (intrinsic region) shown in FIG. 16, this corresponds to the region in which efficiency becomes 0 at 1.2 μm or less. Thus, current does not flow through this region.

In this processing method, however, since light having a visible wavelength (380–800 nm) is shielded or shaded to below a prescribed intensity (brightness), the wafer and the like cannot be confirmed visually. Since wafer sensors and the like using a wavelength of 1 μm or less are typically installed in silicon wafer transport systems for use as sensors that detect the presence of wafers, work is unable to proceed in a state in which light having a wavelength of 1.2 μm or less is not present in the device.

BRIEF SUMMARY OF THE INVENTION

In light of the above circumstances, the object of the present invention is to provide a method for manufacturing a semiconductor device that is able to prevent the occurrence of problems such as connection defects that occur due to forming a highly resistant layer containing a metal oxide on the surface of wiring, a processing system able to prevent the occurrence of problems such as connection defects in a processing step of semiconductor devices without any shading of visible light whatsoever, and a semiconductor device free of problems such as connection defects in the wiring thereby resulting in superior reliability.

The present invention employs the following a method for manufacturing a semiconductor device, processing system and semiconductor device in order to solve the above problems.

Namely, a first aspect of the present invention is to provide a method for manufacturing a semiconductor device comprising: forming an N region and P region on a substrate, forming wiring so as to connect one or both of these N and P regions; and performing a processing step on a semiconductor substrate on which the upper surface of said wiring is exposed using a liquid, wherein said processing step is performed in a state in which the wavelength of light radiated onto said semiconductor substrate is 500 nm to less than 1 μm.

In this method, electromotive force at the PN junction in the semiconductor substrate is reduced and galvanic effects caused by photoexcitation are inhibited by performing the above processing step in a state in which the wavelength of light radiated onto the above substrate is 500 nm to less than 1 μm. As a result, there is no risk of forming a highly resistant layer containing metal oxide on the surface of the wiring, and problems such as connection defects in the wiring are prevented.

Furthermore, the above processing step in the method for manufacturing a semiconductor device may be performed in a state in which the above semiconductor substrate is grounded.

As a result, galvanic effects caused by photoexcitation are eliminated as a result of eliminating electromotive force at the PN junction in the semiconductor substrate by performing the above processing step in a state in which the above semiconductor substrate is grounded.

Furthermore, the above processing step in the method for manufacturing a semiconductor device may be a cleaning step performed during, before or after a step that includes chemical mechanical polishing for forming the above wiring.

As a result, problems such as wiring connection defects for which there is the risk of occurring in the cleaning step are prevented by performing the cleaning step during, before or after a step that includes chemical mechanical polishing (CMP) for forming the above wiring.

A second aspect of the present invention is to provide a processing system comprising a processing unit that processes a semiconductor substrate using a liquid and a light source.

Furthermore, said light source may radiate light having a wavelength of 500 nm to less than 1 μm onto said processing unit.

In the above processing system, a processing step can be performed in a state in which the wavelength of light radiated onto a semiconductor substrate is 500 nm to less than 1 μm by providing a light source that radiates light having a wavelength of 500 nm to less than 1 μm onto the above processing unit.

Furthermore, said processing unit may comprise a rotating section that holds and rotates a semiconductor substrate, and a liquid supply section that supplies liquid to said semiconductor substrate, and said rotating section being grounded.

As a result, problems such as connection defects in the wiring for which there is the risk of occurring in the processing step are effectively prevented as a result of eliminating electromotive force at the PN junction in the semiconductor substrate in the processing step by grounding the above rotating section.

Furthermore, when the light source radiates light having a wavelength of 500 nm to less than 1 μm onto said processing unit, said processing unit may comprise a rotating section that holds and rotates a semiconductor substrate, and a liquid supply section that supplies liquid to said semiconductor substrate, and said rotating section being grounded.

As a result, in addition to inhibiting galvanic effects caused by electromotive force in the semiconductor substrate during the processing step, and preventing the occurrence of problems such as wiring connection defects, the formation of a highly resistant layer containing metal oxide in the N region is inhibited and problems such as connection defects in the wiring are prevented. As a result, the reliability of the semiconductor substrate is improved.

A third aspect of the present invention is to provide a semiconductor device comprising: a first N region and a P region formed on a substrate; wiring formed so as to connect either or both of these N and P regions; and the upper surface of said wiring being exposed to light, wherein a second N region is formed independent of said first N region on said substrate.

In the above semiconductor device, as a result of forming a second N region independent of an N region and P region on a substrate, electromotive force is generated between the P region and the N region and second N region due to galvanic effects caused by photoexcitation, thereby preventing concentration in the N region only. Consequently, the formation of a highly resistant layer containing metal oxide in the N region is inhibited, and problems such as connection defects in the wiring are prevented. As a result, the reliability of the semiconductor device is improved.

Furthermore, in the above semiconductor device, the total surface area of said first N region and said second N region may be 100 to 1/100 times the total surface area of said P region.

Furthermore, in the above semiconductor device said second N region may be formed at the periphery of said substrate.

Furthermore, in the above semiconductor device, said wiring may has any one of Cu, Al and W as its main component.

DETAILED DESCRIPTION OF THE INVENTION

The following provides an explanation of embodiments of the method for manufacturing a semiconductor device, processing system and semiconductor device of the present invention based on the drawings.

EMBODIMENT 1

Figure 1:
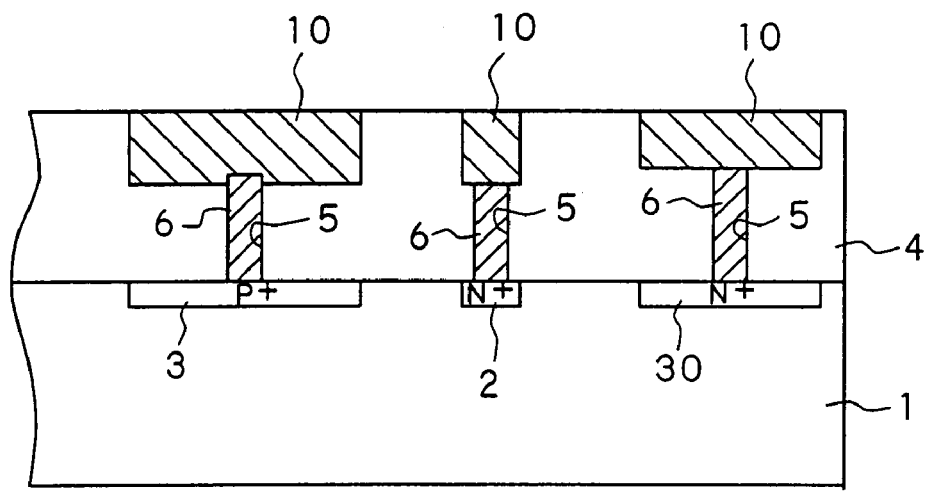
FIG. 1 is a cross-sectional view showing a semiconductor substrate used in a semiconductor device of a first embodiment of the present invention.
Figure 2:
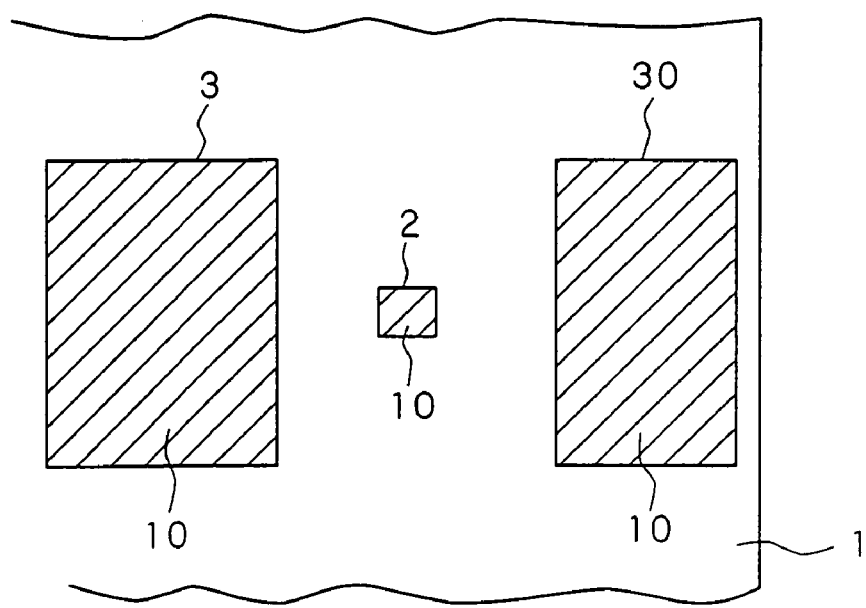
FIG. 2 is an overhead view showing a semiconductor substrate used in a semiconductor device of a first embodiment of the present invention.

FIG. 1 is a cross-sectional view and FIG. 2 is an overhead view showing a semiconductor substrate used in a semiconductor device of a first embodiment of the present invention. In this semiconductor device, N region 2 and P region 3 are formed on the surface of Si wafer (substrate) 1 by ion implantation, and a second N region 30 is formed to the outside of the N region 2, namely at the periphery of Si wafer 1.

SiO$_2$ film 4 is deposited on Si substrate 1 containing N region 2, P region 3 and the second N region 30, a metal such as W, Al or Cu is filled into contact holes 5, which are formed in SiO$_2$ film 4 and extend to N region 2, P region 3 and second N region 30, respectively, to form plug electrodes 6, and channel wiring 10, also referred to as damascene wiring or embedded wiring, is formed on plug electrodes 6 by CMP with its surface exposed.

The channel wiring 10 can also be formed using methods other than CMP such as dry etching.

The second N region 30 is formed to prevent concentration of electromotive force in N region 2 only, and in order to inhibit galvanic effects caused by photoexcitation, the total surface area of N region 2 and second N region 30 is 100 to 1/100 times, preferably 10 to 1/10 times, and more preferably 1 time, the total surface area of P region 3. For example, in the case the surface area of P region 3 is 500 μm$^2$ and the surface area of N region 2 is 1 μm$^2$, then the surface area of second N region 30 is 4 μm$^2$.

In this semiconductor substrate, electromotive force is generated between P region 3, and N region 2 and the second N region 30 due to galvanic effects caused by photoexcitation, thereby preventing electromotive force from concentrating in N region 2 only. Consequently, the formation of a highly resistant layer containing a metal oxide such as CuO is inhibited in N region 2, thereby making it possible to prevent problems such as connection defects in channel wiring 10. As a result, the reliability of the semiconductor device is improved.

As explained above, according to the semiconductor device of the present embodiment, since N region 2 and P region 3 are formed on the surface of Si wafer 1, and the second N layer 21 is additionally formed at the periphery of Si wafer 1 to the outside of this N region 2, electromotive force is generated between P region 3, and N region 2 and the second N region 21, thereby preventing electromotive force from concentrating in N region 2 only. Thus, the formation of a highly resistant film containing a metal oxide such as CuO can be inhibited in N region 2, and problems such as connection defects can be prevented in channel wiring 10. As a result, the reliability of the semiconductor device can be improved.

EMBODIMENT 2

Figure 3:
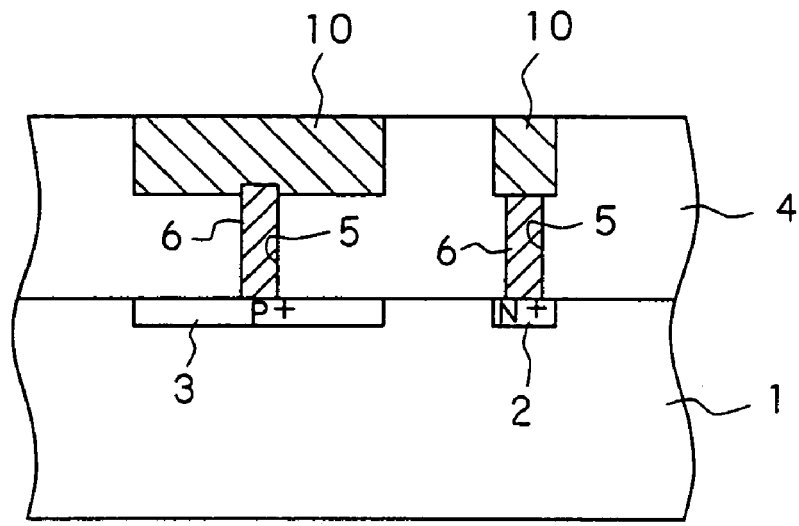
FIG. 3 is a cross-sectional view showing a semiconductor substrate to which is applied a method for manufacturing a semiconductor device of a second embodiment of the present invention.
Figure 4:
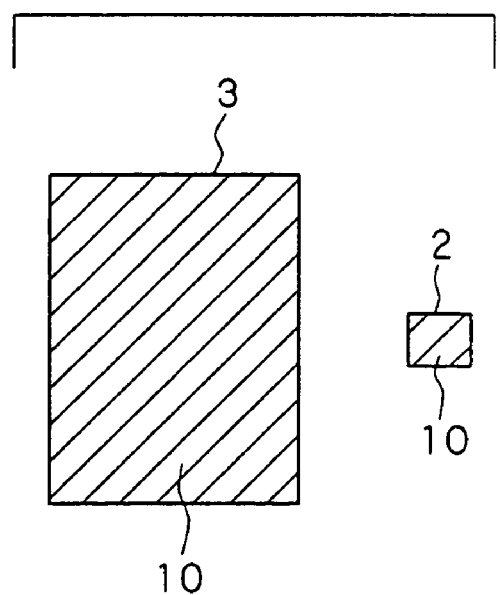
FIG. 4 is an overhead view showing a semiconductor substrate to which is applied a method for manufacturing a semiconductor device of a second embodiment of the present invention.

FIG. 3 is a cross-sectional view and FIG. 4 is an overhead view showing a semiconductor substrate to which is applied a method for manufacturing a semiconductor device of a second embodiment of the present invention. In this semiconductor substrate, N region 2 and P region 3 are formed on the surface of Si wafer 1, SiO$_2$ film 4 is deposited on Si substrate 1 containing N region 2 and P region 3, a metal such as W, Al or Cu is filled into contact holes 5, which are formed in SiO$_2$ film 4 and extend to N region 2 and P region 3, respectively, to form plug electrodes 6, and channel wiring 10 is formed on plug electrodes 6 by CMP with its surface exposed.

The channel wiring 10 can also be formed using methods other than CMP such as dry etching.

Figure 5:
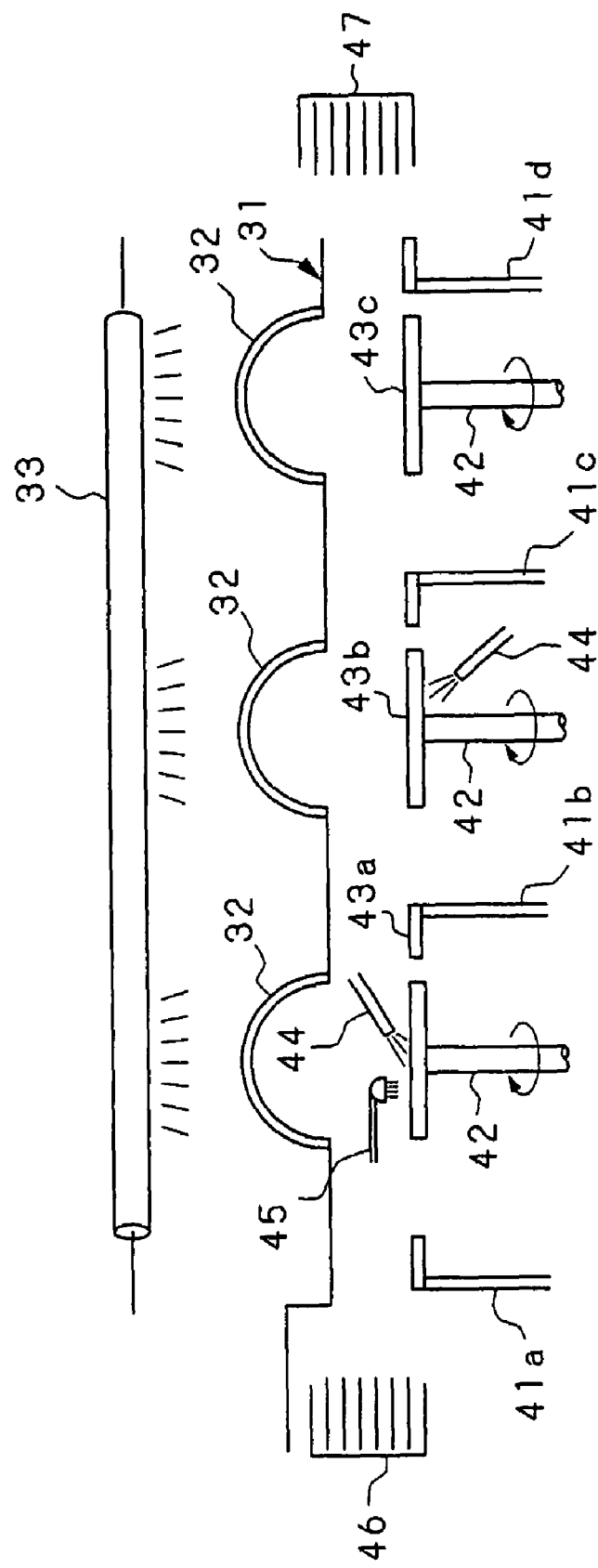
FIG. 5 is a schematic block diagram showing a cleaning system of a second embodiment of the present invention.

The semiconductor substrate is cleaned (processed) using the cleaning system (processing system) shown in FIG. 5.

The cleaning system is composed of a processing unit 31, which cleans the semiconductor substrate using pure water for cleaning (or an electrically conductive cleaning chemical), and a light source 33, which is arranged to the outside of windows 32 of processing unit 31 and radiates light having a wavelength of 500 nm to less than 1 μm onto processing unit 31.

Processing unit 31 is composed of a plurality of transport robots 41a through 41d provided along the direction of transport of the semiconductor substrate, wafer holders 43a through 43c provided between each of these transport robots 41a through 41d that are able to hold and rotate the semiconductor substrate with vertical rotating shafts 42 as their axial centers, nozzles 44 that supply pure water for cleaning (or conductive cleaning chemical) onto the semiconductor substrate, scrub brush 45 that physically cleans the surface of the semiconductor substrate, loading carrier 46 provided at the entrance for the semiconductor substrate, and unloading carrier 47 provided at the exit for the semiconductor substrate.

Wafer holder 43a is for top surface cleaning, center wafer holder 43b is for bottom surface cleaning and exit wafer holder 43c is also referred to as a spin dryer and is for drying.

In this processing system, the semiconductor substrate cleaning step can be carried out in a state in which the wavelength of light radiated onto the semiconductor substrate is 500 nm to less than 1 μm. Thus, galvanic effects caused by photoexcitation are inhibited in the semiconductor substrate during the cleaning step, and the occurrence of problems such as wiring connection defects is prevented using an extremely simple configuration and at low cost.

Figure 6:
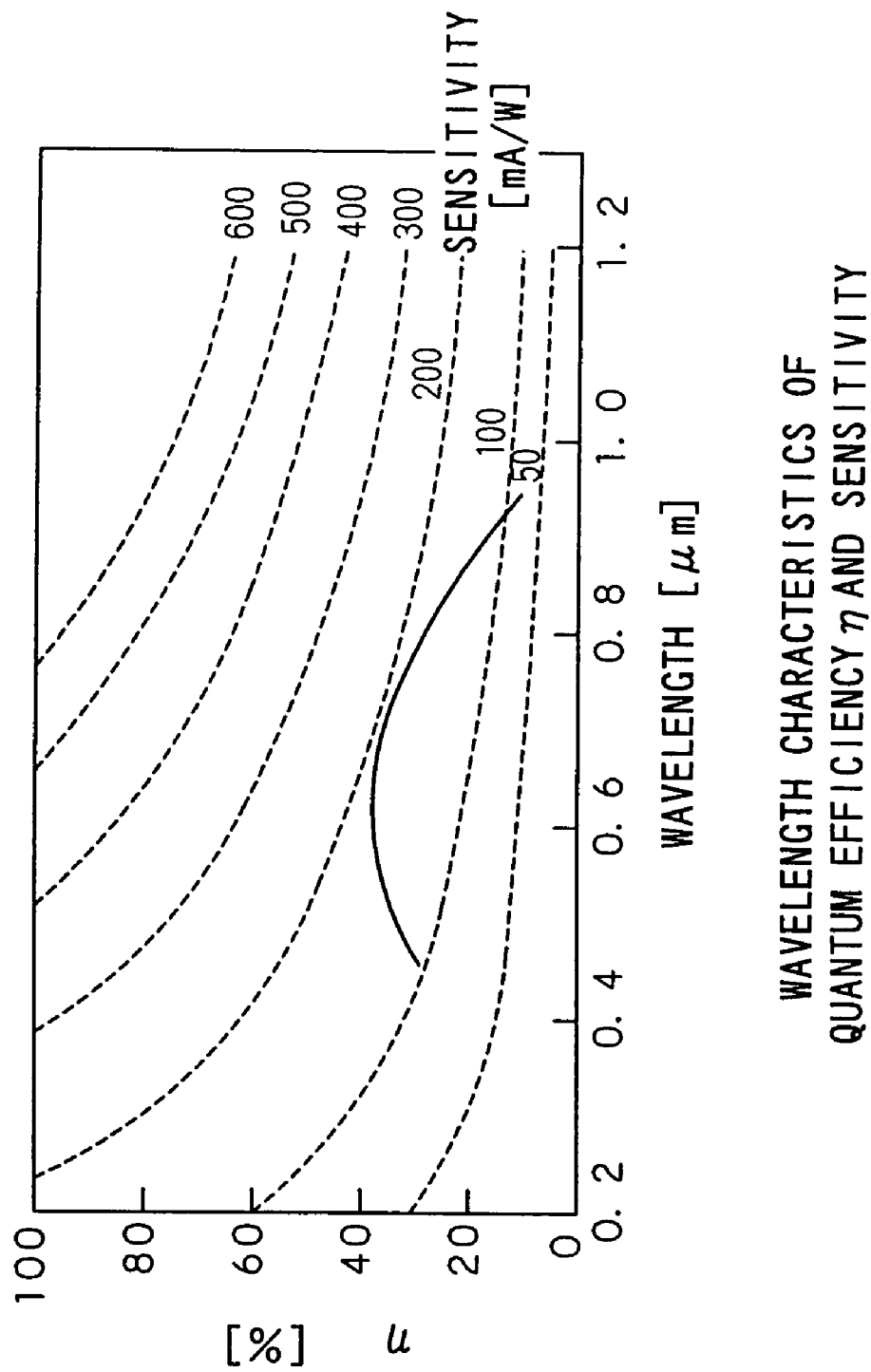
FIG. 6 is a graph showing the wavelength characteristics of quantum efficiency η and sensitivity of a photodiode having an Si-p$^+$-n structure.

FIG. 6 is a graph showing the wavelength characteristics of quantum efficiency η and sensitivity of a photodiode having an Si-p$^+$-n structure. As shown in this graph, the photodiode has stable characteristics within the wavelength range of 0.5 μm (500 nm) to less than 1 μm, and those characteristics attenuate as wavelength becomes longer.

Figure 7:
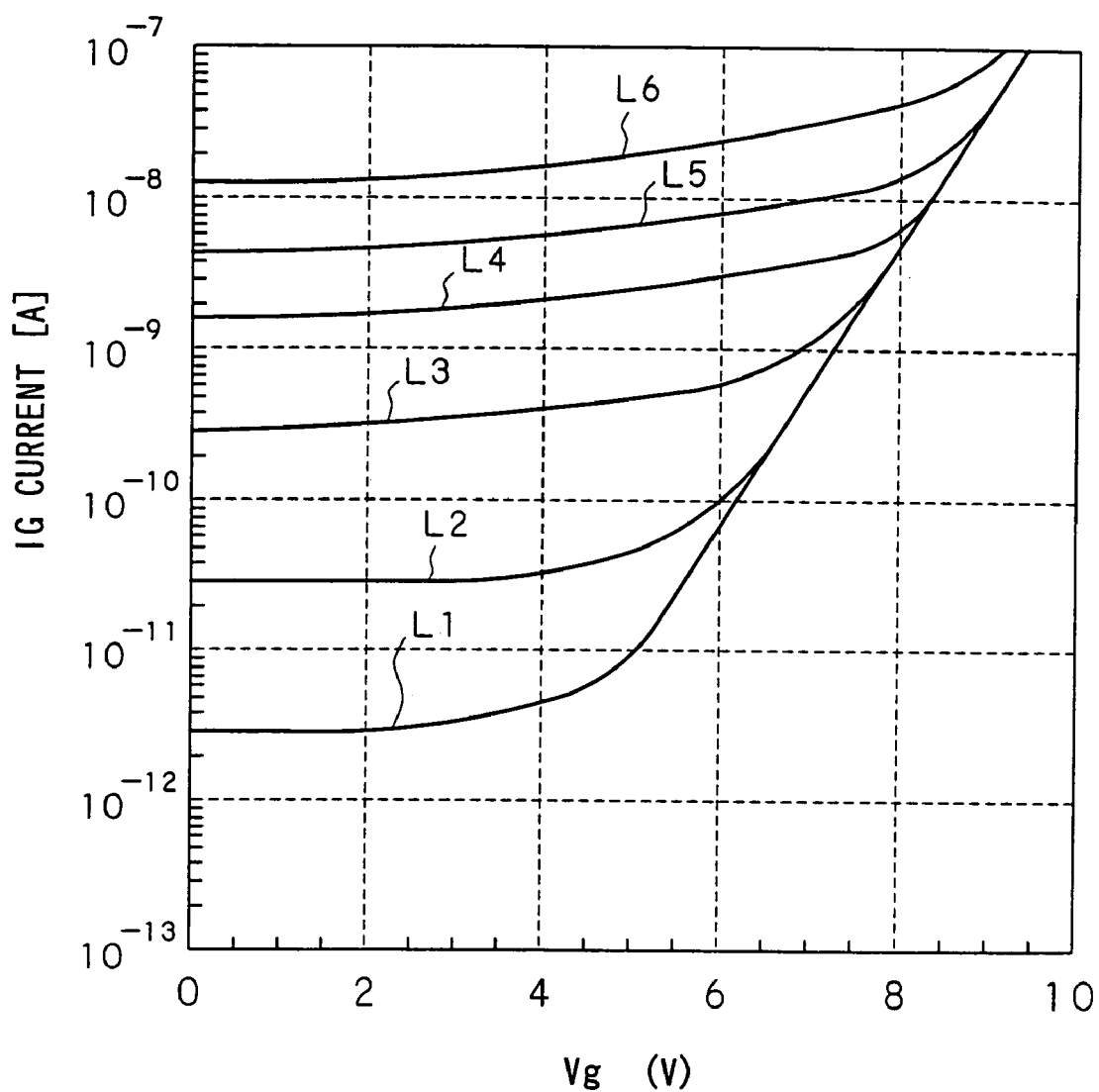
FIG. 7 is a graph showing the dependence of IG current of a PN junction on voltage $V_g$ at room temperature (25° C.).

FIG. 7 is a graph showing the dependency of IG (Intrinsic Gettering) current on voltage $V_g$ of a PN junction at room temperature (25° C.). This graph shows the results for light having a wavelength of 500 nm (L1), 400 nm (L2), 300 nm (L3), 200 nm (L4), 100 nm (L5) and 50 mn (L6).

According to this graph, light L1 having a wavelength of 500 nm has both the smallest IG current and best linearity, and as the wavelength becomes longer, linearity decreases correspondingly. For example, the IG current of light L1 at voltage $V_g$ of 5 V or less is $10^{-11}$ A or less.

Figure 8:
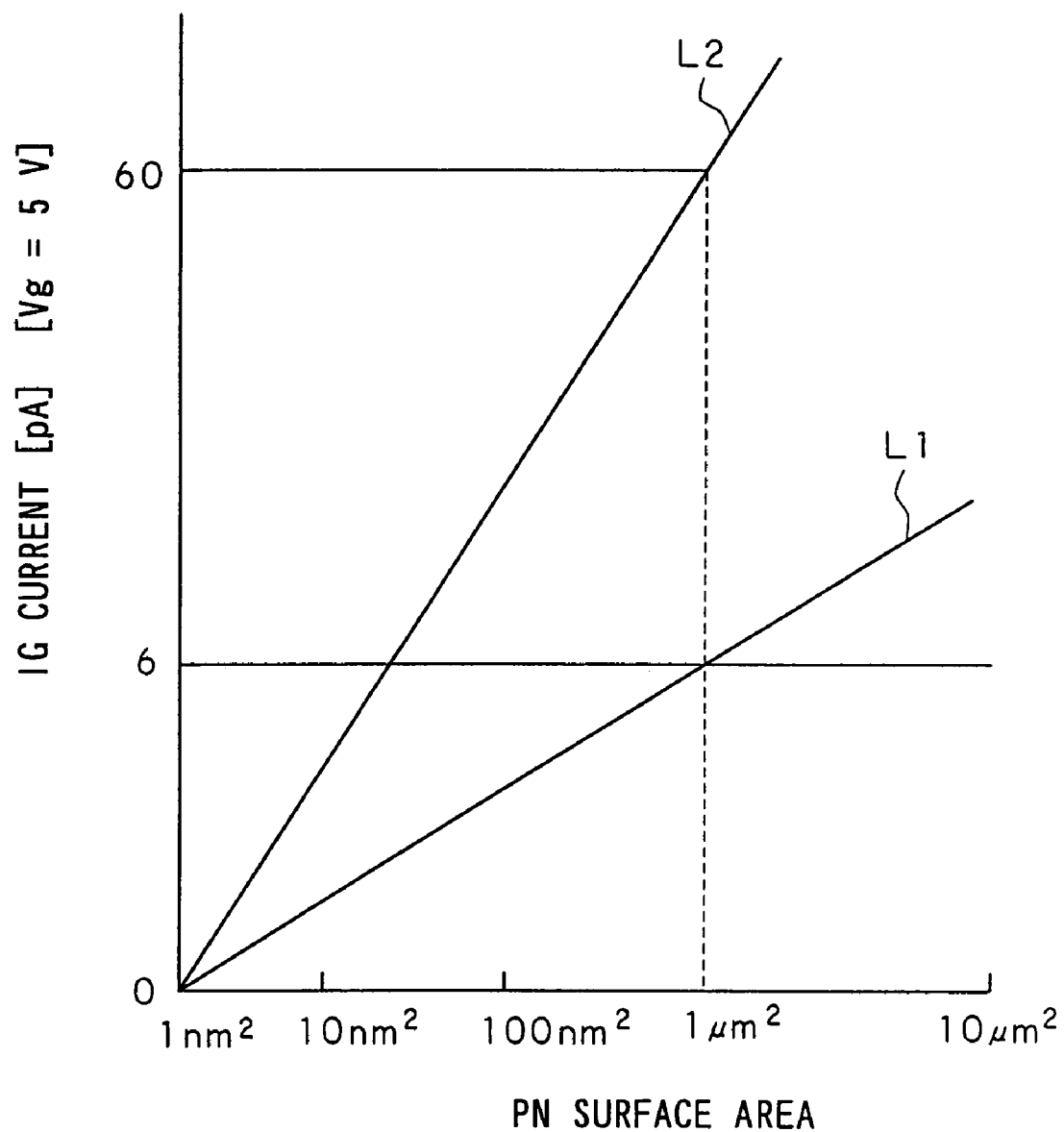
FIG. 8 is a graph showing the dependence of IG current on PN surface area in a PN junction.

FIG. 8 is a graph showing the dependency of IG current on PN surface area in a PN junction, and illustrates the relationship between PN surface area and IG current at 5 $V_g$ (units: pA) for light L1 and L2 having two types of wavelengths.

According to this graph, the smaller the surface area in the PN junction, the lower the allowable value of IG current per unit surface area. For example, in the case of light L1 having a wavelength of 500 nm, if the PN surface area is 1 μm$^2$ or less, the IG current is 6 pA or less. In addition, in the case of light L2 having a wavelength of 400 nm, IG current is 60 pA when the PN surface area is 1 μm$^2$, and IG current is a power of ten larger as compared with the case of light L1 having a wavelength of 500 nm. In this manner, it can be seen that as the wavelength of the light approaches 500 nm, IG current becomes smaller for the same PN surface area.

As has been explained above, according to the cleaning method of a semiconductor substrate of the present embodiment, since a cleaning step is performed in the state in which the wavelength of light radiated onto a semiconductor substrate is 500 nm to less than 1 μm, galvanic effects caused by photoexcitation in the semiconductor substrate can be inhibited, and problems such as wiring connection defects can be prevented.

In addition, according to the cleaning system of the present embodiment, since said cleaning system is composed of a processing unit 31, which cleans the semiconductor substrate using pure water for cleaning (or a conductive cleaning chemical), and a light source 33, which radiates light having a wavelength of 500 nm to less than 1 μm onto processing unit 31, galvanic effects caused by photoexcitation are inhibited in the semiconductor substrate during the cleaning step, and the occurrence of problems such as wiring connection defects is prevented using an extremely simple configuration and at low cost.

EMBODIMENT 3

Figure 9:
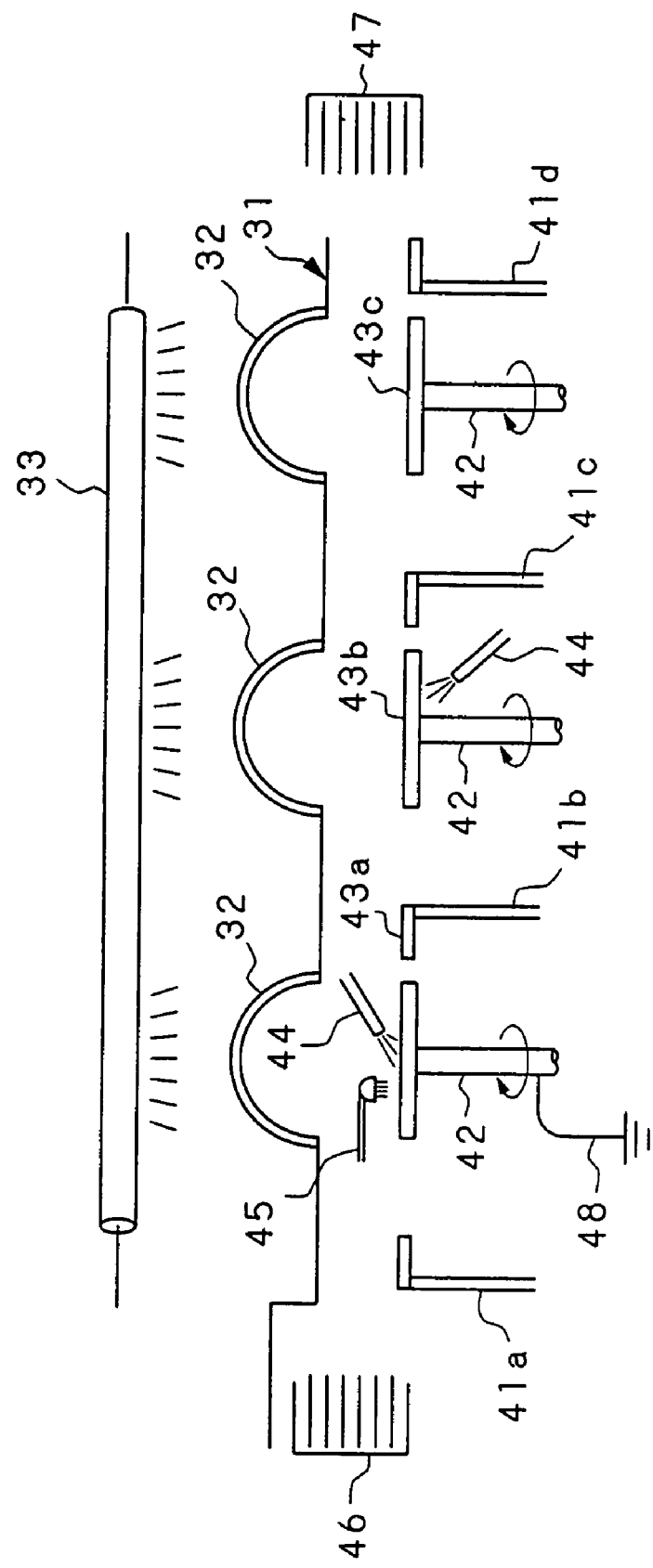
FIG. 9 is a schematic block diagram showing a cleaning system of a third embodiment of the present invention.
Figure 10A:
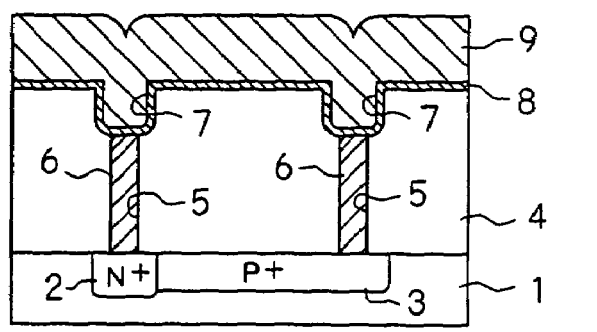
FIGS. 10A and 10B are process diagrams showing a method for manufacturing a semiconductor device of the prior art.
Figure 10B:
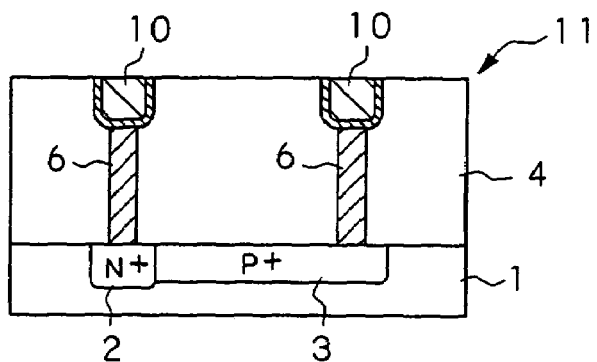
Figure 11:
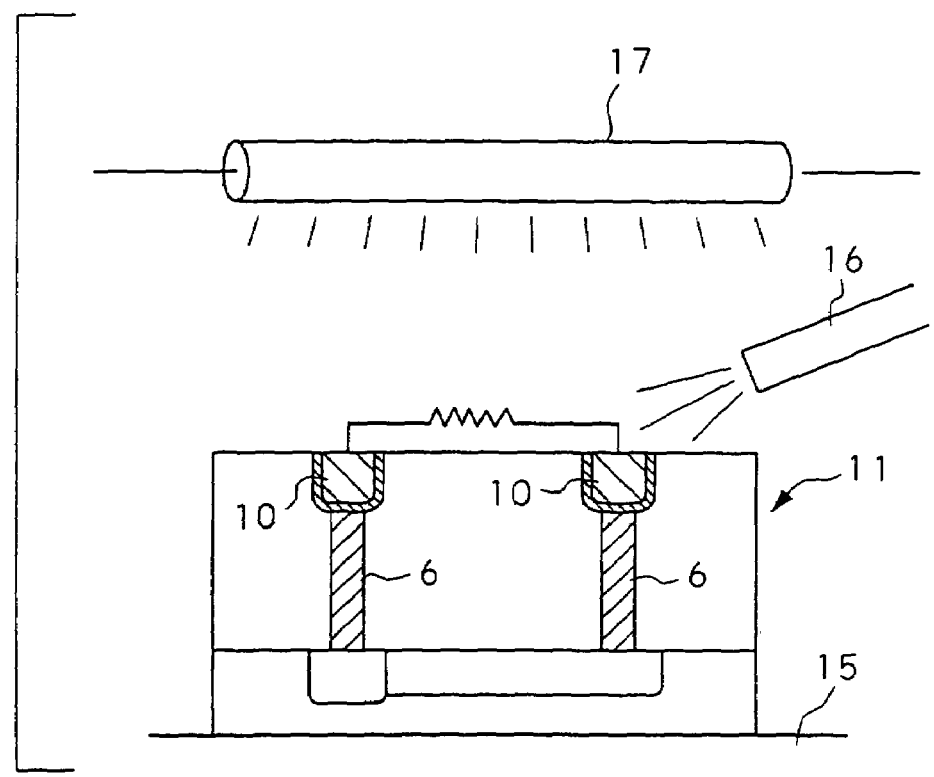
FIG. 11 is a schematic block diagram showing a cleaning system of the prior art.
Figure 12:
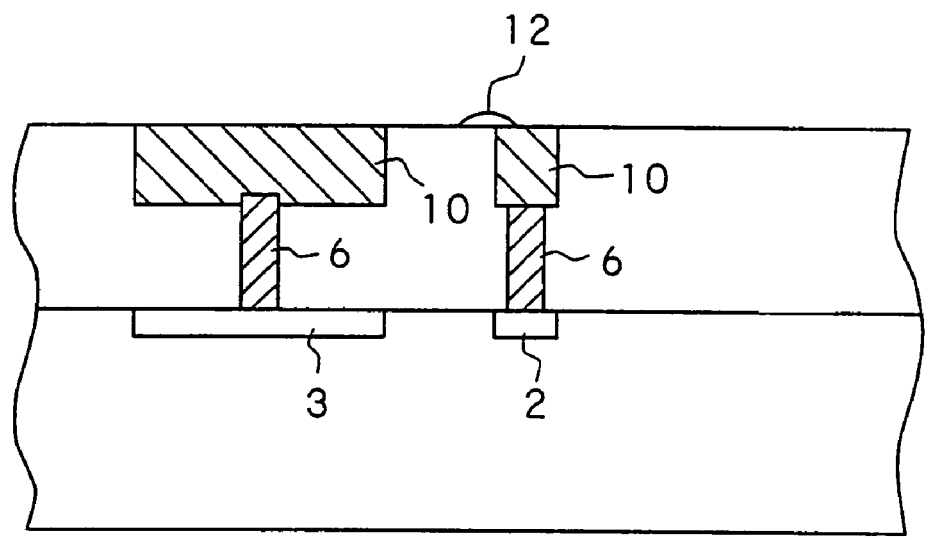
FIG. 12 is a cross-sectional view showing an example of a problem of a semiconductor substrate of the prior art.
Figure 13:
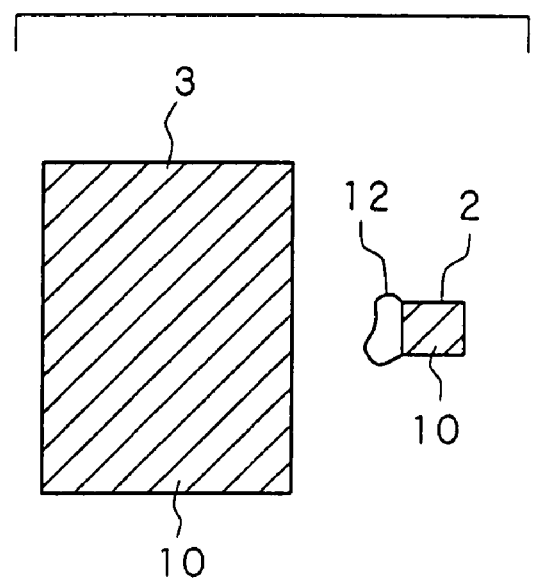
FIG. 13 is an overhead view showing an example of a problem of a semiconductor substrate of the prior art.
Figure 14:
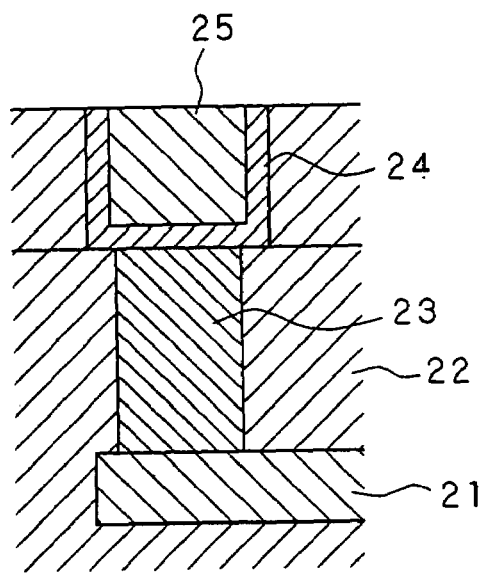
FIG. 14 is a cross-sectional view of Cu wiring formed with a semiconductor substrate processing method of the prior art.
Figure 15:
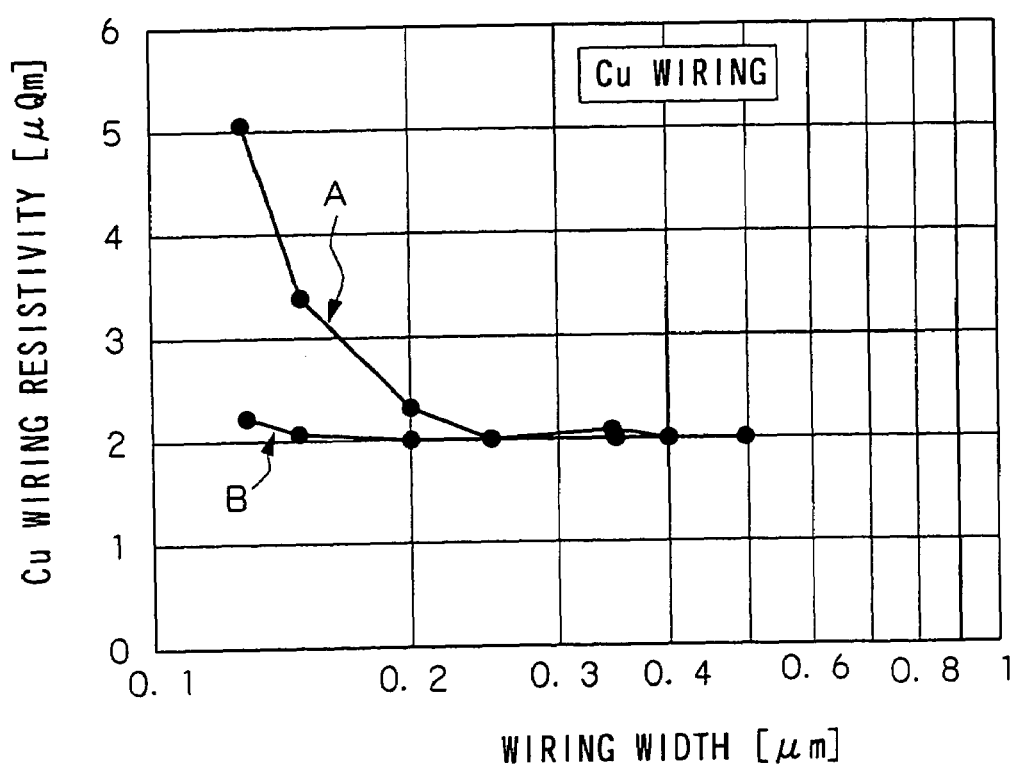
FIG. 15 is a graph showing the wiring resistance of Cu wiring formed with a semiconductor substrate processing method of the prior art.
Figure 16:
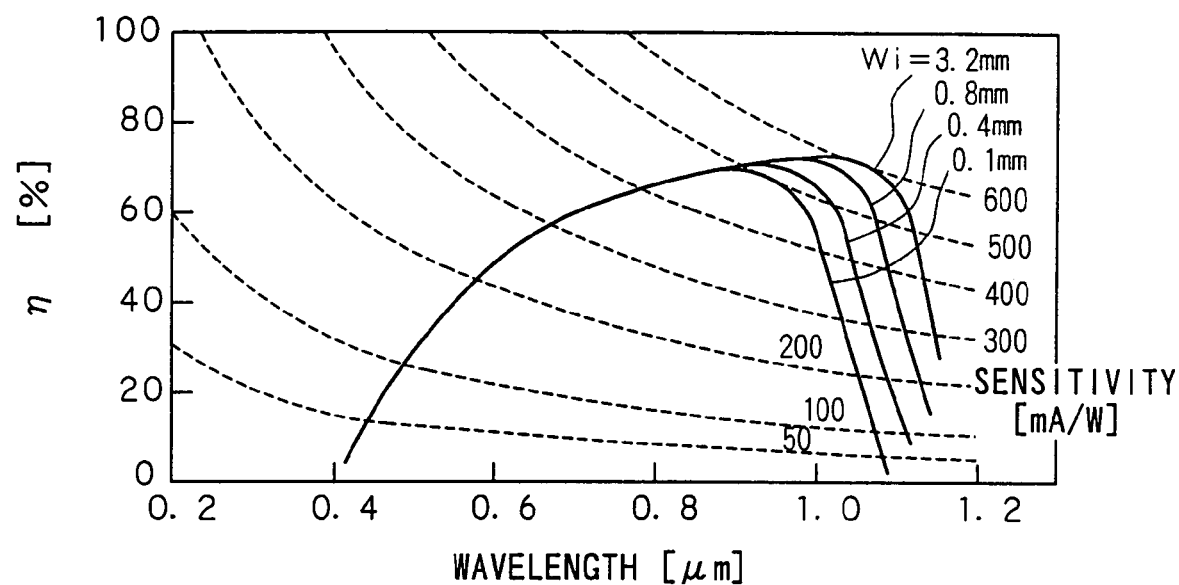
FIG. 16 is a graph showing the wavelength characteristics of quantum efficiency η and sensitivity of a photodiode employing an Si-p$^+$-i-n structure having a broad layer.

FIG. 9 is a schematic block diagram showing a cleaning system of a third embodiment of the present invention. This cleaning system is different from the cleaning system of the second embodiment described above in that ground 48 is electrically connected to rotating shaft 42 of wafer holder 43a on the entrance side.

According to the cleaning system of the present embodiment, since ground 48 is electrically connected to rotating shaft 42 of wafer holder 43a, electromotive force in the PN junction of the semiconductor substrate can be eliminated, thereby making it possible to effectively prevent problems such as connection defects in channel wiring 10 for which there is the risk of occurrence in this processing step.

Although the above has provided an explanation of each of the embodiments of the method for manufacturing a semiconductor device, processing system and semiconductor device of the present invention based on the drawings, specific constitutions are not limited to these embodiments of the present invention, but rather the design can be altered and so forth within a range that does not deviate from the purport of the present invention.

For example, although a second N region 21 was additionally formed at the periphery of Si wafer 1 to the outside of N region 2 in the above first embodiment, the location where the second N region 21 is formed along with its quantity can be suitably altered.

In addition, the surface area of the second N region 30 should be that which is able to prevent concentration of electromotive force in N region 2 only. More specifically, the total surface area of this second N region 30 and N region 2 should be suitably set within a range of 100 to 1/100 times the total surface area of P region 3.

In addition, although light source 33 that radiates light at a wavelength of 500 nm to less than 1 μm is used in the cleaning system of the second embodiment, optics may be used instead of this light source which have been composed so as to radiate light at a wavelength of 500 nm to less than 1 μm.

What is claimed is:

1. A method for manufacturing a semiconductor device comprising:
    forming a first N region and a P region on a substrate, forming wiring so as to connect one or both of the first N and the P regions; and
    performing a processing step on a semiconductor substrate on which the upper surface of said wiring is exposed using a liquid applied to said semiconductor substrate and a light source radiating light onto said semiconductor substrate, wherein said processing step is performed in a state in which the wavelength of light radiated onto said semiconductor substrate is 500 nm to less than 1 μm, wherein said processing step is a cleaning step performed during, before or after a step that includes chemical mechanical polishing (CMP) for forming said wiring, said wavelength of light radiated onto said semiconductor substrate being 500 nm to less than 1 μm in order to reduce an electromotive force at a PN junction in said semiconductor substrate, thereby inhibiting galvanic effects due to photoexcitation before, during or after said step including CMP, and preventing oxidation of a surface of said wiring, wherein the exposing of the upper surface of said wiring of the semiconductor substrate to the liquid is performed concurrently with the exposing of the upper surface of said semiconductor substrate to the light source radiating light.

2. A method according to claim 1, wherein said processing step is performed in a state in which said semiconductor substrate is grounded.

3. A method according jo claim 1, further comprising:
forming on said substrate a second N region that is independent of said first N region.

4. A method according to claim 3, wherein the total surface area of said first N region and said second N region is 100 to 1/100 times the total surface area of said P region.

5. A method according to claim 3, wherein said second N region is formed at the periphery of said substrate.

6. A method according to claim 3, wherein said wiring contains any one of Cu, Al and W as its main component.

7. A method for manufacturing a semiconductor device comprising:
forming a first N region and a P region on a semiconductor substrate;
forming winng so as to connect at least one of the P region and the N region; and
exposing the upper surface of said wiring using a liquid applied to said semiconductor substrate and a light source radiating light onto said semiconductor substrate;

wherein said exposing step is a cleaning step performed during, before or after a step that includes chemical mechanical polishing (CMP) for forming said wiring; and wherein said exposing step is performed in a state in which the wavelength of light radiated onto said semiconductor substrate is 500 nm to less than 1 μm in order to reduce an electromotive force at a PN junction in said semiconductor substrate, thereby inhibiting galvanic effects due to photoexcitation before, during or alter said step including CMP, and preventing oxidation of a surface of said wiring.

8. A method according to claim 7, wherein said exposing step is performed in a state in which said semiconductor substrate is grounded.

9. A method according to claim 7, further comprising:
forming on said substrate a second N region that is independent of said first N region.

10. A method according to claim 9, wherein the total surface area of said first N region and said second N region is 100 to 1/100 times the total surface area of said P region.

11. A method according to claim 9, wherein said second N region is formed at the periphery of said substrate.

12. A method according to claim 9, wherein said wiring contains any one of Cu, Al and W as its main component.

* * * * *